United States Patent [19]

Turner

[11] Patent Number: 4,760,032
[45] Date of Patent: Jul. 26, 1988

[54] SCREENING OF GATE OXIDES ON SEMICONDUCTORS

[75] Inventor: Timothy E. Turner, Denton, Tex.

[73] Assignee: SGS-Thomson Microelectronics, Inc., Carrollton, Tex.

[21] Appl. No.: 55,335

[22] Filed: May 29, 1987

[51] Int. Cl.⁴ ............................................. H01L 21/66
[52] U.S. Cl. ........................................ 437/8; 437/227; 324/158 T
[58] Field of Search .............................. 437/8, 923, 227; 324/71.5, 158 T; 148/DIG. 162

[56] References Cited

U.S. PATENT DOCUMENTS

| | | | |
|---|---|---|---|
| 3,750,268 | 8/1973 | Wang | 437/8 |
| 3,851,245 | 11/1974 | Baker et al. | 324/65 R |
| 3,889,188 | 6/1975 | Trindade | 324/158 T |
| 4,224,733 | 9/1980 | Spadea | 437/48 |
| 4,296,372 | 10/1981 | Feuerbaum | 437/8 |
| 4,542,340 | 9/1985 | Chakravarti et al. | 324/158 R |

FOREIGN PATENT DOCUMENTS

| | | | |
|---|---|---|---|
| 0155542 | 12/1981 | Japan | 324/71.5 |
| 0164534 | 10/1982 | Japan | 437/8 |
| 0136323 | 7/1985 | Japan | 437/8 |

Primary Examiner—Olik Chaudhuri
Attorney, Agent, or Firm—Roland Plottel

[57] ABSTRACT

Testing of the gate oxides of all the transistors of a single die in a silicon wafer to be diced into a plurality of dice in a single operation is effected at an intermediate stage of the fabrication process by providing a metal layer contacting selectively each of the gate electrodes of a die at an intermediate stage of the processing and providing between the layer and the wafer a voltage of amplitude insufficient to cause significant tunneling current through good gate oxides but sufficient to cause significant tunneling current through defective gate oxides.

5 Claims, 1 Drawing Sheet 4,760,032

SCREENING OF GATE OXIDES ON SEMICONDUCTORS

FIELD OF THE INVENTION

This invention relates to the manufacture of silicon integrated circuit devices including MOS devices.

BACKGROUND OF THE INVENTION

MOS devices, particularly MOS transistors, make up a large part of most high-density integrated circuit devices. Such devices are characterized by a thin layer of silicon oxide over a portion of a monocrystalline silicon substrate over which lies a gate electrode, usually of polycrystalline silicon, to which is applied a voltage for affecting in a desired manner the properties of the underlying silicon.

For reliable operation, it is important that the integrity of the gate oxide be maintained. However, gate-oxide pinholes have long been one of the most serios problems facing MOS devices. Moreover, as MOS technology advances, and the density of MOS devices in an integrated circuit are increased, it becomes necessary to employ very thin oxides, sometimes only a few monolayers thick. Because of the importance of compatibility with existing circuits, it is usual to operate such thin oxide devices at the standard five volt power supply which imposes a very high electric field across the oxide. Use of such high electric fields makes it imperative that the oxide be free of defects, if the integrated circuit is to operate reliably in the field.

Defective devices once incorporated into equipment are very hard to find and expensive to replace, particularly if the equipment is in field use. Accordingly, there is considerable interest in methods to screen devices having defective oxides prior to their incorporation into equipment.

The most common method for screening oxides is burn-in. This typically involves operating a device at a higher than normal voltage level for a prescribed period of time, sometimes at elevated temperatures. Oxide failures tend to be greatly accelerated by higher voltages, and to a lesser extent by higher temperatures.

However, it is important that the applied voltage be less than the gate punch-through voltage, which is apt to be only slightly larger than the maximum power supply voltage in state-of-the-art devices. This imposes limits on the magnitude of the power supply voltage that can be safely employed without introducing hot electron problems or causing transistor shorts.

Another factor that is important is the need to stress essentially equally all of the gate oxides in an integrated circuit device. This becomes difficult in complex devices, such as random logic devices. In such complex devices, it is difficult to find a set of input states that will stress all of the internal transistors essentially equally. As a result, burn-in is becoming of less utility in screening gate oxides.

Another common method of screening gate oxides is to apply a short high voltage stress to the oxides during a final test of the device. This technique has been most successfully applied for testing the oxide layer of the MOS capacitors used in dynamic random access memories (DRAMs). This has worked well in this application because all the capacitor plates are tied to a common node. However, this technique is very difficult to apply to random logic devices because it requires a set of test vectors that stress each gate once and only once. Alternately, it would be required to add additional circuitry to allow all gates to be connected to one or a few nodes, which wold undesirably add to the number of devices in the integrated circuit. For these reasons, this screening technique has not been applied to any significant extent to random logic devices.

There is the additional problem that as the wear out lifetime of the oxides approaches the expected lifetime of the device, the stress used to weed out potentially defective oxide layers may reduce the remaining lifetime of the good oxide layers.

To avoid these problems, non-destructive gate oxide screening techniques were developed. Such techniques look for very low levels of leakage through the oxide without requiring the need for high voltages to stress the oxide layers. This approach is based on the theory that a defective oxide will show a higher FowlerNordheim tunneling current even at low voltages. In this technique, a voltage is placed across the oxide layer being tested of a magnitude that provides a level of Fowler-Nordheim tunneling current that is just below the detectable level of a good oxide layer. As a result, a defective oxide layer will yield a detectable current while a good one will not and will not be degraded.

While this technique is readily applicable to DRAMs it cannot be readily applied to random logic devices because it is not possible to sense very small currents if the current path includes a pass transistor. Thus the gate electrode of the oxide layer being tested would require a direct low resistance path to an external sense device or to an on-chip test structure to detect the low level of current. This generally is not practicable.

SUMMARY OF THE INVENTION

The present invention is an improved gate oxide screening technique. It is based on the premise that the time dependent gate oxide failures are caused by defects in the oxide that would allow abnormally large tunneling currents in the region of the defect.

Several workers have shown that hole trapping at the silicon/silicon dioxide interface precedes the destructive breakdown of a gate oxide. The hole trapping increases the electric field in the region of the traps causing more tunneling which causes more hole trapping until an unstable runaway condition is set up and the defective area passes enough current to locally melt some of the overlying polysilicon electrode, then the melted silicon is pulled into the oxide defect causing shorting.

It is known that the Fowler-Nordheim tunneling current through a good oxide is very predictable and that defective oxides show a higher than normal tunneling current at voltages near the point at which tunneling can start to be detected at a good oxide. Moreover, the tunneling current tends to be an exponential function of the tunneling voltage. The invention involves the use of a forced voltage as a screen at, or preferably just below, the lowest value, necessary to pass detectable amounts of tunneling current in a good oxide. Defective oxides stressed at the same voltage will draw a much greater current. This screen can detect defective oxides without damaging the good oxides.

Moreover, to apply this technique to random logic devices, this screening is performed at an intermediate stage in the fabrication of such random logic devices.

In particular, in a preferred embodiment of the invention, the screening is done after the silicon wafer has been processed in normal fashion through the stage where the polysilicon gate layer has been deposited and patterned over the oxide-coated silicon substrate, covered by a deposited insulating layer (typically oxide) to be used to isolate the polycrystalline silicon layer from the subsequent first level metal interconnect layer and then covered with photoresist. Normally the next step would be to expose the photoresist over the deposited insulation layer selectively where the insulation layer is to be removed to permit contact between the subsequent first-level metal and the polycrystalline gate layer and between the subsequent first-level metal and the active silicon area contacts. Instead, at this point, the wafers to be screened would be exposed to a mask which exposed the photoresist over the deposited insulation only where there are to be formed the first-level metal-to-polysilicon contacts. When the deposited insulation is removed where photoresist is exposed and removed, and a metal layer is deposited thereover, a single metal contact is established by this metal layer to all of the gate electrodes. At this point, the metal layer is then patterned to divide it into die-sized areas by normal photolithographic techniques, so that access may be to the individual dice, each of which is to accommodate an individual random logic integrated circuit. Once the metal layer has been patterned into die-sized areas, a single probe may be stepped across the wafer landing, in turn, once on each die. Alternatively, a "bed of nails" could make electrical contact to each die-shaped area in one operation. Once electrical contact has been established with a metal rectangle corresponding to one die area and another electrical contact made to the backside of the wafer, a voltage of the desired level is applied across each die area and the resulting current measured. This will force the same voltage on each gate electrode of the die area. If any gate in the die area is defective, the die area will draw an abnormal current sufficient to be detected as a failure. The location of each falling die area is mapped in the usual fashion, so that after dicing, the defective die may be removed before it is packaged.

Although in theory, this non-destructive test should weed out all dies with a defective oxide, in some instances there may be defective oxides which have a higher than normal hole trap density and so may not initially show a higher than normal tunneling current. If such a situation exists, this tunneling current screen may not be adequate. In such a case, there may also be added a brief high voltage screen at this same stage of the manufacturing process to identify these defects. The screening voltage and its duration should be chosen so as not to appreciably impact unfavorably the remaining lifetime of the good oxides.

Following this screening operation, the metal layer used for contacting the polycrystalline gate layer is removed, and another mask defining only the active contact regions applied. After the deposited insulation is opened at such active contact regions, the first level metal is deposited and the processing continued in the usual fashion.

The invention will be better understood from the following more detailed description taken with the accompanying drawing.

DETAILED DESCRIPTION

Figure 1:
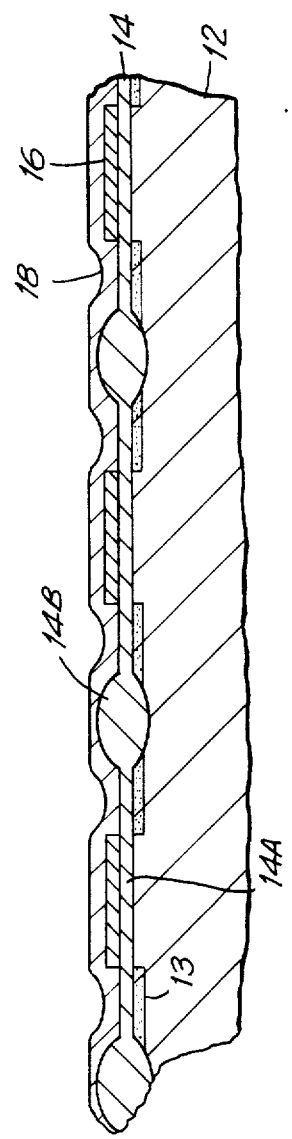
FIG. 1 shows a cross section of a portion of a silicon wafer at a particular stage in its fabrication in prior art fashion.

FIG. 1 shows a portion of a silicon wafer which has been prepared to an intermediate stage of its normal fabrication process. As is well known, it is typical to do most of the processing on relatively large wafers each of which is to be subsequently cut up into a plurality of dice, each of which will include at least one integrated circuit. Depicted in FIG. 1 is a portion of a single die area of a much larger wafer. It should be appreciated that the drawing is not to scale. In the stage depicted, the silicon wafer 10 whose bulk is of single crystal silicon has an overlying surface layer of silicon oxide 14. The layer 14 includes thin gate oxide portions 14A and thicker field oxide portions 14B dividing the wafer into discrete active regions, each of which will include one or more transistors. As shown, each active region is designed to accommodate a single transistor. To this end, each active region includes a pair of heavily doped regions 13 spaced apart to serve as the source and drain of the transistor. A gate electrode 16 of polycrystalline silicon overlies the thin gate oxide region 14A in each active region. Additionally, an insulating layer, typically of silicon dioxide 18, is shown deposited over the silicon wafer. Normally photolithography would next be used to open this layer 18 to expose portions of the polycrystalline gate electrodes and also portions of the source and drain regions of the silicon wafer and then the first-level metal deposited as a layer over the patterned silicon layer to contact both the polycrystalline silicon electrodes and the active silicon wafer. This metal layer in turn would then be appropriately patterned.

Figure 2:
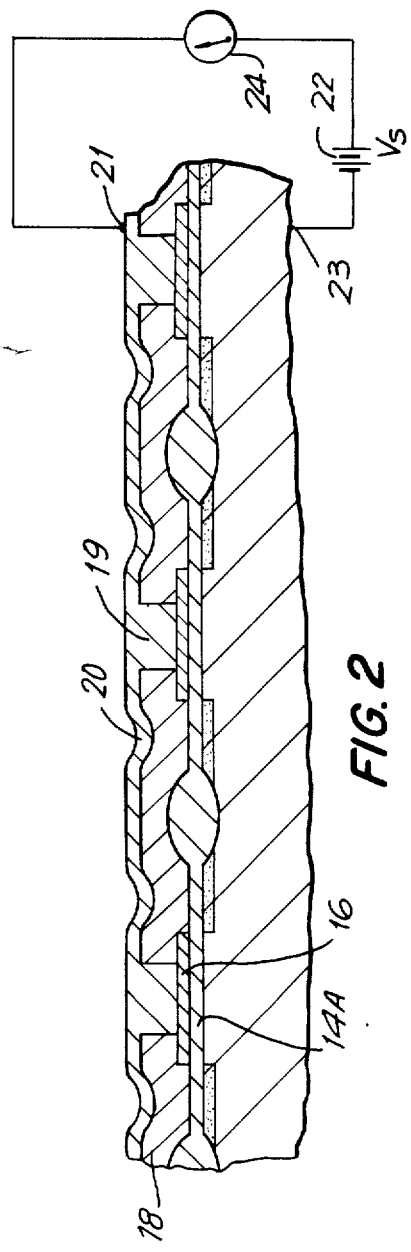
FIG. 2 shows at a subsequent stage a cross section of the silicon wafer modified for the practice of the invention.

However, for the practice of the present invention, the silicon layer is patterned to expose only the polysilicon electrodes and thereafter there is deposited a metal layer 20, typically of aluminum, which is used to contact each of the polycrystalline electrodes 16 by way of the contact openings or vias 19, (shown filled by metal in FIG. 2). This layer would be patterned so that an individual portion would overlie a single die area of the wafer, as discussed. The resultant is seen in FIG. 2. Thereafter one electrical contact 21 is provided to this metal layer 20 and another electrical contact to the back side of the wafer as shown schematically by connection 23. A voltage source 22 and a current meter 24 are then connected serially between these two contacts. The voltage supplied by the source 22 is adjusted to be just below the value that results in a detectable current in the meter 24 for a defect-free gate oxide layer underlying the polycrystalline gate electrode. Optionally, a higher voltage can also be applied to wear out defective oxides while not appreciably damaging good oxides. As discussed previously, an abnormally large current would indicate a die area which included at least one defective gate oxide and so would be defective.

Also as previously discussed, in some instances it would be advantageous also to include a short high-voltage pulse as a further screen.

After each die area is tested, the metal layer 20 would be etched away and photolithography would be used in conventional fashion to open the insulating layer 18 also to expose regions of the active device, such as the source and drain regions, where connection is desired by the first level metal. After the insulating layer 18 has been so prepared, the first level metal is deposited uniformly over the silicon wafer and thereafter patterned in the usual fashion to provide connections, as desired, to the polycrystalline electrodes and the source and drain regions.

Thereafter, the silicon wafer is processed in the usual fashion and eventually diced to form individual dice each of which includes an integrated circuit.

It should be understood that various modifications may be made in the specific illustrative embodiment described without departing from the spirit and scope of the invention. For example, it is feasible to test in one operation only a selected group of transistors in an individual die area, in which case only those transistors in the group to be tested would have their gate electrodes connected to the metal layer used for testing. This can be readily done by opening the insulating layer 18 only over their gate elecrodes before deposition of the metal layer so that only their gate oxide layers will be tested in parallel in a single operation.

What is claimed:

1. In the manufacture of integrated circuits which involves forming from a silicon wafer a plurality of individual dice each of which includes an integrated circuit comprising a plurality of MOS transistors each of which has a polycrystalline silicon gate electrode overlying a gate oxide layer, the process of testing simultaneously the gate oxides of a group of transistors in a single die area comprising the steps of preparing the silicon wafer to include polycrystalline gate electrodes over gate oxide regions to be tested, depositing an insulating layer over the wafer and patterning this layer to expose selectively portions of the gate electrodes of the group of transistors to be tested simultaneously, depositing a metal layer to form electrical connections to the gate electrodes where exposed, patterning the metal layer so that each discrete portion of the metal layer covers portions only of the gate electrodes of the group of transistors whose gate oxide regions are to be tested in parallel together, then applying a voltage between said metal layer an the silicon wafer for passing current simultaneously through the gate oxide regions, and measuring the current to detect abnormally large currents in any gate oxide of the chosen transistors in the die area.

2. The process of claim 1 in which the voltage applied has a value which results in insignificant current flow through a defect-free gate oxide but significant current flow through a defective gate oxide.

3. The process of claim 2 in which the group of transistors to be tested simultaneously are all the transistors in a single die area.

4. The process of claim 1 which includes the further steps of removing the patterned metal layer after the measuring step, forming additional openings in the insulating layer to expose active regions of the silicon wafer where connections to a first level metal are desired, and depositing the first level metal to form connections to both the polycrystalline gate electrodes and exposed active regions of the silicon wafer.

5. A method for testing gate members during the manufacture of semiconductor devices which comprises:

(a) providing a semiconductor wafer substrate having source, drain and gate members thereon;

(b) providing an insulating layer on said substrate, source, drain and gate members;

(c) coating said insulating layer with a photoresist layer and imagewise exposing said photoresist layer through an exposure mask which corresponds to said gate members, and developing said photoresist layer to remove at least a portion of the photoresist only at the insulating layer locations on the gate member locations;

(d) removing at least a part of the insulating layer portions which lie on the gate members and leaving the insulating layer portions which do not lie on said gate members;

(e) depositing an electrically conductive metal layer on said insulating layer so as to form an electrical connection between said metal layer and each gate member but no direct electrical connection between said metal layer and said substrate;

(f) dividing said metal layer into a plurality of sections corresponding to a plurality of semiconductor dice; and providing a voltage potential between the individual metal layer sections and said substrate and measuring any current flow therebetween;

(g) removing said metal section from said substrate; and (h) removing the insulating layer from the regions where metal contact to active or other regions is desired.

* * * * *